United States Patent [19]
Yabuki et al.

[11] Patent Number: 5,332,978
[45] Date of Patent: Jul. 26, 1994

[54] FREQUENCY SYNTHESIZER

[75] Inventors: Hiroyuki Yabuki, Kawasaki; Mitsuo Makimoto, Yokohama, both of Japan

[73] Assignee: Matsushita Electric Industrial Co., Ltd., Osaka, Japan

[21] Appl. No.: 25,467

[22] Filed: Mar. 3, 1993

[30] Foreign Application Priority Data

| Mar. 11, 1992 | [JP] | Japan | 4-052533 |
| Mar. 11, 1992 | [JP] | Japan | 4-052534 |
| Jun. 15, 1992 | [JP] | Japan | 4-154701 |
| Jun. 26, 1992 | [JP] | Japan | 4-168831 |

[51] Int. Cl.⁵ .................................. H03L 7/00
[52] U.S. Cl. ............................ 331/2; 331/11; 331/14; 331/25
[58] Field of Search ................... 331/2, 14, 11, 25; 360/51; 342/175

[56] References Cited

U.S. PATENT DOCUMENTS

| 3,546,617 | 11/1968 | Westwood | 331/2 |
| 3,560,868 | 2/1971 | Oberbeck | 331/2 |
| 3,863,174 | 1/1975 | Klinger | 331/2 |
| 3,899,747 | 8/1975 | Giles et al. | 331/2 |
| 3,927,384 | 12/1975 | Jezo | 331/2 |
| 4,320,355 | 3/1982 | Kawagoe et al. | 331/2 |
| 4,605,908 | 8/1986 | Broughton | 331/11 |
| 4,654,604 | 3/1987 | Smith et al. | 331/1 A |
| 4,659,999 | 4/1987 | Motoyama et al. | 331/2 |
| 4,791,387 | 12/1988 | Hasegawa et al. | 331/2 |
| 4,806,879 | 2/1989 | Troxel | 331/1 A |
| 4,868,513 | 9/1989 | Piercy et al. | 328/134 |
| 4,912,432 | 3/1990 | Galani et al. | 331/2 |
| 5,072,298 | 12/1991 | Sumiyoshi | 331/14 |
| 5,128,633 | 7/1992 | Martin et al. | 331/2 |
| 5,146,186 | 9/1982 | Veilia | 331/16 |
| 5,152,005 | 9/1992 | Bickley | 331/2 |
| 5,157,355 | 10/1992 | Shikakura et al. | 331/14 |
| 5,206,769 | 4/1993 | Bailey et al. | 360/51 |
| 5,225,840 | 7/1993 | Hsu | 342/175 |
| 5,276,913 | 1/1994 | Lee et al. | 331/14 |
| 5,278,874 | 1/1994 | Liu et al. | 331/11 |

FOREIGN PATENT DOCUMENTS

| 56-106430 | 8/1981 | Japan | 331/2 |
| 2214735 | 9/1989 | United Kingdom | 331/2 |

Primary Examiner—Raymond A. Nelli
Attorney, Agent, or Firm—Lowe, Price, LeBlanc & Becker

[57] ABSTRACT

A multi-channel frequency synthesizer comprises first, second, and third phase-locked loop circuits. The loop gains of the second and third phase-locked loop circuits are set higher than that of the first phase-locked loop circuit. Furthermore, a phase adjustment circuit is provided in the first phase-locked loop circuit. The second phase-locked loop circuit is activated before changing the channel. During the channel switching operation, the third phase-locked loop circuit transforms the frequency quickly on the basis of an output of the second phase-locked loop circuit. After being switched to the first phase-locked loop circuit, the phase adjustment operation is carried out. Thus, this frequency synthesizer makes it possible to realize the speedy inter-channel frequency switching operation without causing deterioration in other characteristics such as S/N or C/N in the normal condition.

24 Claims, 6 Drawing Sheets

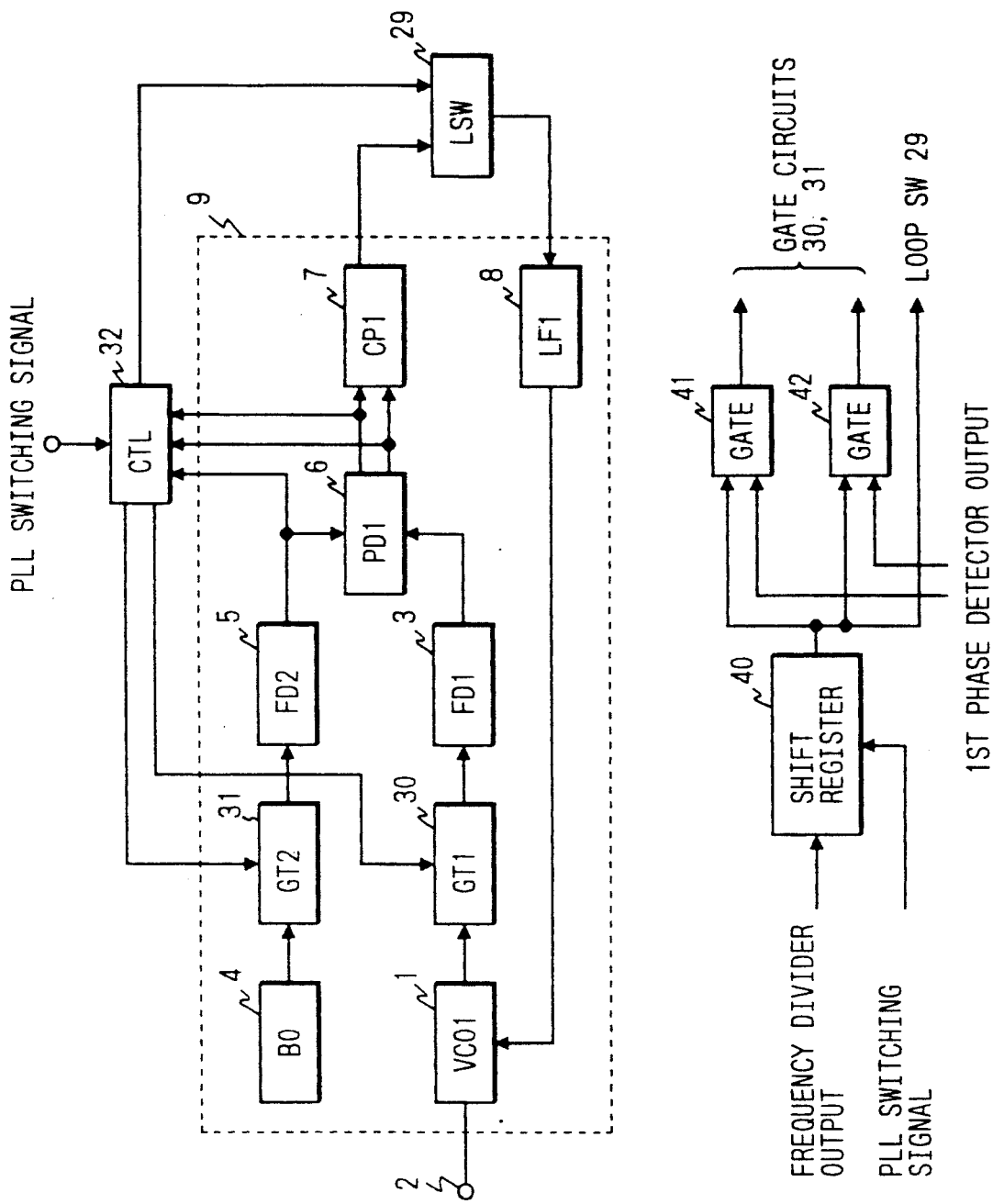

FREQUENCY SYNTHESIZER

BACKGROUND OF THE INVENTION

1. Field of the Invention

The present invention relates to a frequency synthesizer used for a high-frequency multi-channel radio communication apparatus or the like, and more particularly to a phase-locked loop (PLL) type frequency synthesizer characterized by the speedy frequency switching operation.

2. Description of the Prior Art

The frequency synthesizer is not only an important component of the multi-channel communication apparatus but is also used widely in various radio communication apparatus. Recent radio communication system is changing from analogue to digital. As the time-division multiple access (TDMA) has been adopted in such digital radio communication system, the speed-up of the inter-channel frequency switching operation is becoming very important for the frequency synthesizer.

Hereinafter, a conventional frequency synthesizer will be described.

FIG. 8 shows a circuit configuration of one example of the conventional frequency synthesizer. In FIG. 8, a reference numeral 101 represents a voltage-controlled oscillator, and a reference numeral 102 represents a high-frequency output terminal. A reference numeral 103 represents a first frequency divider which divides the output frequency of the voltage-controlled oscillator 101, and a reference numeral 104 represents a basic oscillator (e.g. a normal temperature-compensated crystal oscillator). A reference numeral 105 represents a second frequency divider which divides the output frequency of the basic oscillator 104, and a reference numeral 106 represents a phase detector (e.g. a normal digital phase/frequency comparator) which detects the phase difference between the output of the first frequency divider 103 and the output of the second frequency divider 105.

A reference numeral 107 represents a charge pump which transforms the output of the phase detector 106 into a drive signal for an integrator, and a reference numeral 108 represents a loop filter serving as the integrator, which feeds the output of the charge pump 107 back to the voltage-controlled oscillator 101 after removing high-frequency components thereof. And, a reference numeral 109 represents a phase-locked loop circuit which is constituted by above components 101 through 108.

An operation of thus constituted frequency synthesizer will be discussed below.

In the phase-locked condition, the first and second frequency dividers generate individual outputs identical with each other in their frequencies (reference frequencies) and phases. Therefore, the charge pump generates a high-impedance output.

On the other hand, output frequencies of these first and second frequency dividers become out of phase with each other when the channel is changed. In this case, the phase detector executes the frequency correction by which the frequency is pulled in so as to approximate to the target frequency, and then charges or discharges the loop filter through the charge pump. (Frequency pull-in mode)

Furthermore, the phase detector executes the phase correction so as to pull in the frequency to be identical with the target frequency, and charges or discharges the loop filter through the charge pump. (Phase pull-in mode)

A series of above operations becomes speedy with high loop gain; i.e. high sensitivity of the voltage-controlled oscillator, small frequency dividing number (i.e. high reference frequency), or small time constant of the loop filter.

However, the reference frequency cannot be set freely in the multi-channel radio communication apparatus as it is univocally determined in accordance with channel spacing. If the sensitivity of the voltage-controlled oscillator is increased, the S/N (signal/noise) or C/N (carrier/noise) ratio of the voltage-controlled oscillator itself is deteriorated. If the time constant of the loop filter is decreased, the noise bandwidth is increased. Therefore, there was a problem such that the S/N or C/N ratio of the frequency synthesizer is deteriorated.

SUMMARY OF THE INVENTION

Accordingly, the present invention has a purpose, in view of above-described problem or disadvantage, to provide a frequency synthesizer capable of realizing the speedy inter-channel frequency switching operation without deteriorating other characteristics such as S/N or C/N ratio.

In order to accomplish this purpose, a first aspect of the present invention provides first, second, and third phase-locked loop circuits in the multi-channel frequency synthesizer. The loop gains of the second and third phase-locked loop circuits are set higher than that of the first phase-locked loop circuit. Furthermore, a phase adjustment circuit is provided in the first phase-locked loop circuit.

In accordance with the first aspect of the present invention, the second phase-locked loop circuit is activated before changing the channel. During the channel change operation, the third phase-locked loop circuit transforms the frequency quickly on the basis of a basic signal source, which is an output of the second phase-locked loop circuit. After being switched to the first phase-locked loop circuit, the phase adjustment operation is carried out. Thus, the first aspect of the present invention makes it possible to realize the speedy inter-channel frequency switching operation without causing deterioration in other characteristics such as S/N or C/N in the normal condition.

A second aspect of the present invention provides first and second phase-locked loop circuits and a third phase-locked loop circuit including a mixer in the multi-channel frequency synthesizer. The loop gain of the second phase-locked loop circuit is set higher than that of the first phase-locked loop circuit. Furthermore, a phase adjustment circuit is provided in the first phase-locked loop circuit.

In accordance with the second aspect of the present invention, the second phase-locked loop circuit is activated before changing the channel. During the channel change operation, the third phase-locked loop circuit including the mixer transforms the frequency quickly. After being switched to the first phase-locked loop circuit, the phase adjustment operation is carried out. Thus, the second aspect of the present invention makes it possible to realize the speedy inter-channel frequency switching operation in the same manner as the first aspect of the present invention.

Furthermore, a third aspect of the present invention provides first and second phase-locked loop circuits in the multi-channel frequency synthesizer. The second phase-locked loop circuit includes a frequency divider consisting of a plurality of fractional frequency dividers. And, the first phase-locked loop circuit includes the phase adjustment circuit.

Thus, the third embodiment of the present invention makes it possible to realize the speedy inter-channel frequency switching operation.

In accordance with this third embodiment, the reference frequency of the second phase-locked loop circuit is optionally set so as to increase the loop gain.

The above and other objects, features and advantages of the present invention will become more apparent from the following detailed description which is to be read in conjunction with the accompanying drawings.

BRIEF DESCRIPTION OF THE DRAWINGS

FIG. 2 is a circuit block diagram showing a phase adjustment circuit constituting an essential part of the frequency synthesizer in accordance with the first, second, and third embodiments of the present invention;

FIG. 3 is a circuit block diagram showing a control circuit constituting an essential part of the phase adjustment circuit of FIG. 2;

DETAILED DESCRIPTION OF THE PREFERRED EMBODIMENTS

Hereinafter, with reference to accompanying drawings, preferred embodiments of the present invention will be explained in detail.

FIRST EMBODIMENT

Figure 1:
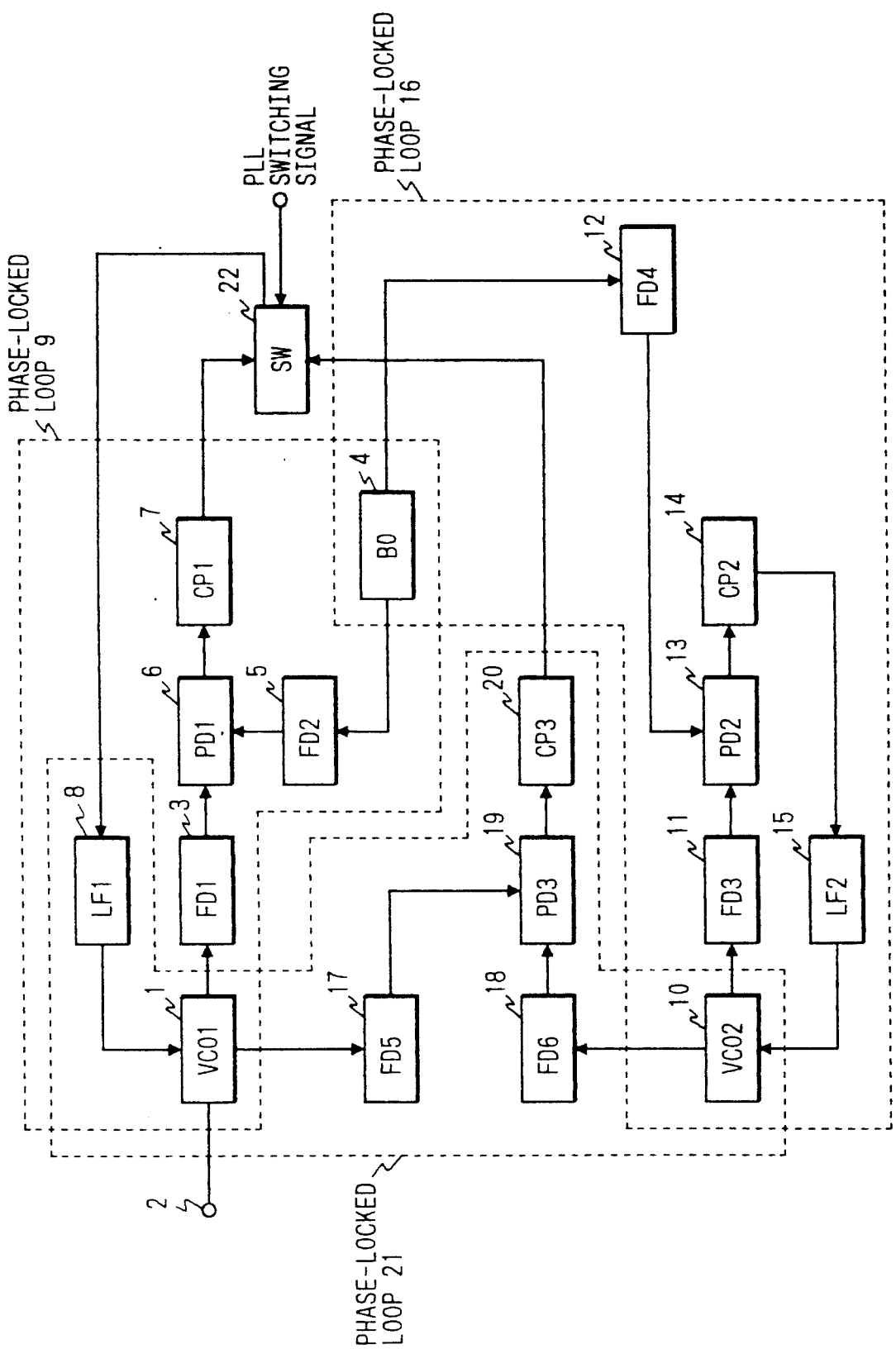
FIG. 1 is a circuit block diagram showing a frequency synthesizer in accordance with the first embodiment of the present invention.

FIG. 1 shows a circuit configuration of the frequency synthesizer in accordance with the first embodiment of the present invention. In FIG. 1, a reference numeral 1 represents a first voltage-controlled oscillator (abbreviated by VCO1), and a reference numeral 2 represents a high-frequency output terminal. A reference numeral 3 represents a first frequency divider (abbreviated by FD1) which divides the output frequency of the first voltage-controlled oscillator 1, and a reference numeral 4 represents a basic oscillator (abbreviated by BO) which is, for example, a normal temperature-compensated crystal oscillator. A reference numeral 5 represents a second frequency divider (abbreviated by FD2) which divides the output frequency of the basic oscillator 4, and a reference numeral 6 represents a first phase detector (abbreviated by PD1) which detects the phase difference between the output of the first frequency divider 3 and the output of the second frequency divider 5.

A reference numeral 7 represents a first charge pump (abbreviated by CP1) which transforms the output of the first phase detector 6 into a drive signal for a first integrator, and a reference numeral 8 represents a first loop filter serving as the first integrator, which feeds the output of the first charge pump 7 back to the first voltage-controlled oscillator 1 after removing high-frequency components thereof. And, a reference numeral 9 represents a first phase-locked loop circuit which is constituted by above components 1 through 8.

The frequency synthesizer further incudes second and third phase-locked loop circuits 16 and 21. The second phase-locked loop 16 comprises a second voltage-controlled oscillator (abbreviated by VCO2) 10, a third frequency divider (abbreviated by FD3) 11 which divides the output frequency of the second voltage-controlled oscillator 10, a fourth frequency divider (abbreviated by FD4) 12 which divides the output frequency of the basic oscillator 4, a second phase detector (abbreviated by PD2) 13 which detects the phase difference between the output of the third frequency divider 11 and the output of the fourth frequency divider 12, a second charge pump (abbreviated by CP2) 14 which transforms the output of the second phase detector 13 into a drive signal for a second integrator, and a second loop filter (abbreviated by LF2) 15 serving as the second integrator, which feeds the output of the second charge pump 14 back to the second voltage-controlled oscillator 10 after removing high-frequency components thereof.

The third phase-locked loop circuit 21 comprises a fifth frequency divider (abbreviated by FD5) 17 which divides the output frequency of the first voltage-controlled oscillator 1, a sixth frequency divider (abbreviated by FD6) 18 which divides the output frequency of the second voltage-controlled oscillator 10, a third phase detector (abbreviated by PD3) 19 which detects the phase difference between the output of the fifth frequency divider 17 and the output of the sixth frequency divider 18, a third charge pump (abbreviated by CP3) 20 which transforms the output of the third phase detector 19 into a drive signal for the first integrator, and the first loop filter 8 serving as the first integrator, which feeds the output of the third charge pump 20 back to the first voltage-controlled oscillator 1 after removing high-frequency components thereof.

There is provided a switch 22, which is disposed before the first loop filter 8 to select the first phase-locked loop circuit 9 or the third phase-locked loop circuit 21.

An operation of the above-described frequency synthesizer will be discussed below. In order to make the understanding easy, let the first voltage-controlled oscillator 1 and the second voltage-controlled oscillator 10 be identical with each other in their oscillation frequencies, and further let the fourth frequency divider 12 and the second frequency divider 5 be identical with each other in their dividing numbers.

The second phase-locked loop circuit 16 is deactivated after completing one frequency switching operation and is again activated before initiating the next frequency switching operation. As the second phase-locked loop circuit 16 serves as the basic signal source of the third phase-locked loop circuit 21, it must has frequency stability but is not required high performance in S/N or C/N characteristics.

For this reason, the reference frequency of the second phase-locked loop circuit 16 is restricted to be identical with that of the first phase-locked loop circuit 9. It is, however, possible to increase the loop gain of the second phase-locked loop circuit 16 by increasing the sensitivity of the second voltage-controlled oscillator 10 or by decreasing the time constant of the second loop filter 15. Thus, the speedy frequency switching operation can be realized.

When the channel is switched, the third phase-locked loop circuit 21 switches the frequency on the basis of the output of the second phase-locked loop circuit 16 serving as the basic signal source.

In this case, each of the sensitivity of the first voltage-controlled oscillator 1 and the time constant of the first loop filter 8 must be maintained in a limited range in order not to deteriorate the normal characteristics of the first phase-locked loop circuit 9. On the contrary, the reference frequency (i.e. dividing number) of the third phase-locked loop circuit 21 can be largely changed to be fairly higher than those of the first and second phase-locked loop circuits 9, 16. Therefore, the loop gain of the third phase-locked loop circuit 21 is fairly increased by increasing its reference frequency, resulting in a very speedy frequency switching operation. Thus, the loop gains of the second and third phase-locked loop circuits 16, 21 are set higher than that of the first phase-locked loop circuit 9.

Thereafter, the switch 22 responds to the phase-locked loop switching signal (PLL switching signal) to change from the third phase-locked loop circuit 21 to the first phase-locked circuit 9.

During this switching operation, the first and third phase-locked loop circuits 9 and 21 are identical with each other in the frequency but are not identical in their phases. Accordingly, the transient response is required in order to correct their phases. This transient response tends to enlarge the overall time required for the frequency switching operation. In order to solve this problem, the phase adjustment means is provided in the switching operation.

FIG. 2 shows a circuit configuration of the phase adjustment circuit constituting an essential part of the frequency synthesizer shown in FIG. 1.

In FIG. 2, components suffixed by the reference numerals 1 through 9 are the same components as those disclosed in FIG. 1. Therefore, their explanations are omitted here.

A reference numeral 29 represents a loop switch (abbreviated by LSW) which interposes between the first charge pump 7 and the first loop filter 8. A reference numeral 30 represents a first gate circuit (abbreviated by GT1) which interposes between the first voltage-controlled oscillator 1 and the first frequency divider 3, and a reference numeral 31 represents a second gate circuit (abbreviated by GT2) which interposes between the basic oscillator 4 and the second frequency divider 5. And, a reference numeral 32 represents a controller (abbreviated by CTL) which receives the PLL switching signal, the output of either the first frequency divider 3 or the second frequency divider 5, and the output of the first phase detector 6, so as to control the loop switch 29 and the first and second gate circuits 30, 31.

An operation of above-explained phase adjustment circuit will be discussed. In the switching operation from the third phase-locked loop circuit 21 to the first phase-locked loop circuit 9, the controller 32 activates the first and second gate circuits 30, 31 on the basis of the output of the first phase detector 1 and the PLL switching signal. These first and second gate circuits 30, 31 control the inputs to the first and second frequency dividers 3 and 5, respectively. The controller 32 controls these first and second frequency dividers 3 and 5 in accordance with the time corresponding to the phase difference, so that two inputs to the first phase detector 6 are in phase.

Furthermore, the controller 32 generates a loop control signal which builds up a predetermined time late after the PLL switching signal builds up. With this loop control signal, the controller 32 directly controls the loop switch 29.

The phase adjustment operation is executed in this manner in the beginning of the loop switching control, so that the frequency switching operation can be accomplished within a short period of time. After the frequency switching operation is completed, the system performs normal functions as a frequency synthesizer.

FIG. 3 shows a detailed circuit configuration of the controller 32 shown in FIG. 2. In FIG. 3, a reference numeral 40 represents a three-bit shift register, which receives the output of either the first frequency divider 3 or the second frequency divider 5 as a clock signal and receives the PLL switching signal as a reset signal. Reference numerals 41, 42 represent gate circuits, each receiving the output of the shift register 40 and the output of the first phase detector 6.

An operation of above-mentioned controller 32 will be discussed below.

The three-bit shift register 40 generates the loop control signal delayed from the build-up of the PLL switching signal by an amount equal to a three-time period of the phase reference frequency. With this loop control signal, the controller 32 directly controls the loop switch 29.

Furthermore, the gates circuits 41, 42 gate the loop control signal and the output of the first phase detector 6 in such a manner that the phase adjustment can be carried out during a three-time period of the phase reference frequency after the PLL switch signal builds up. With this function, the gate circuits 41, 42 produce the control signals supplied to the first and second gate circuits 30, 31.

The phase adjustment operation is executed in this manner in the beginning of the loop switching control, so that the frequency switching operation can be accomplished within a short period of time. After the frequency switching operation is completed, the system performs normal functions as a frequency synthesizer.

As is apparent from the foregoing description, the first embodiment of the present invention provides the first, second, and third phase-locked loop circuits. The loop gains of the second and third phase-locked loop circuits are set higher than that of the first phase-locked loop circuit. Furthermore, the phase adjustment circuit is provided in the first phase-locked loop circuit. Thus, the first embodiment of the present invention makes it possible to realize the speedy inter-channel frequency switching operation.

Though the first and second voltage-controlled oscillators have the same oscillation frequency in this embodiment, it is also possible to reduce the frequency of the second voltage-controlled oscillator 10 into 1/L (L: a positive integer) of that of the first voltage-controlled oscillator 1 in order to save electric power consumption. In such a case, it is needless to say that the dividing number of the fourth frequency divider 12 is L times as large as that of the second frequency divider 5 and the reference frequency of the second phase-locked loop circuit 16 is 1/L of that of the first phase-locked loop circuit 9.

It is also preferable that the second phase-locked loop circuit 16 is always activated, though it is deactivated until the channel switching operation initiates in the above-described embodiment.

Furthermore, it is necessary to use the same basic oscillator so as to be in phase of reference frequencies of the first, second, and third phase-locked loop circuits.

Moreover, the phase adjustment circuit is not limited to the disclosed one. Therefore, any other circuit can be adopted as long as it has a function of adjustment the phases of the first and second frequency dividers during the switching operation.

Still further, the first and second loop filters are constituted by nonlinear active elements.

SECOND EMBODIMENT

Figure 4:
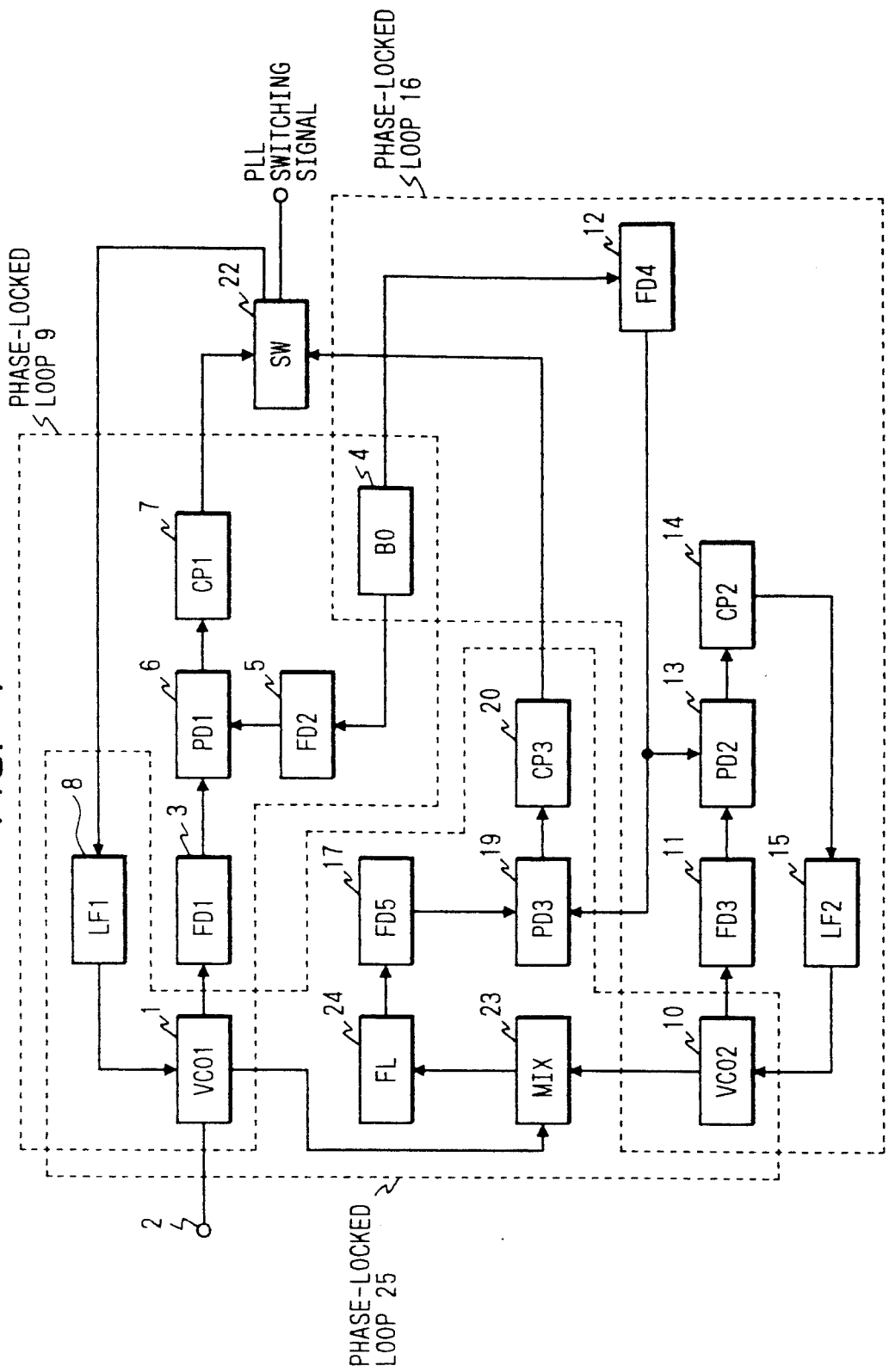
FIG. 4 is a circuit block diagram showing a frequency synthesizer in accordance with the second embodiment of the present invention.

FIG. 4 shows a circuit configuration of the frequency synthesizer in accordance with the second embodiment of the present invention.

The frequency synthesizer in accordance with the second embodiment also includes first, second, and third phase-locked loop circuits and a switch. The first phase-locked loop circuit 9 includes the first voltage-controlled oscillator 1, the first frequency divider 3 which divides the output frequency of the first voltage-controlled oscillator 1, the basic oscillator 4 which is, for example, a normal temperature-compensated crystal oscillator, the second frequency divider 5 which divides the output frequency of the basic oscillator 4, the first phase detector 6 which detects the phase difference between the output of the first frequency divider 3 and the output of the second frequency divider 5, the first charge pump 7 which transforms the output of the first phase detector 6 into a drive signal for the first integrator, and the first loop filter 8 serving as the first integrator, which feeds the output of the first charge pump 7 back to the first voltage-controlled oscillator 1 after removing high-frequency components thereof.

The second phase-locked loop circuit 16 includes the second voltage-controlled oscillator 10, the third frequency divider 11 which divides the output frequency of the second voltage-controlled oscillator 10, the fourth frequency divider 12 which divides the output frequency of the basic oscillator 4, the second phase detector 13 which detects the phase difference between the output of the third frequency divider 11 and the output of the fourth frequency divider 12, the second charge pump 14 which transforms the output of the second phase detector 13 into the drive signal for the second integrator, and the second loop filter 15 serving as the second integrator, which feeds the output of the second charge pump 14 back to the second voltage-controlled oscillator 10 after removing high-frequency components thereof.

The third phase-locked loop 25 comprises a mixer 23 which combines the output of the first voltage-controlled oscillator 1 with that of the second voltage-controlled oscillator 10 to produce an intermediate-frequency output, a filter 24 which removes unnecessary components from the intermediate-frequency output of the mixer 23, the fifth frequency divider 17 which divides the output frequency of the filter 24, the third phase detector 19 which detects the phase difference between the output of the fourth frequency divider 12 and the output of the fifth frequency divider 17, the third charge pump 20 which transforms the output of the third phase detector 19 into the drive signal for the first integrator, and the first loop filter 8 serving as the first integrator, which feeds the output of the third charge pump 20 back to the first voltage-controlled oscillator 1 after removing high-frequency components thereof.

There is provided the switch 22, which is disposed before the first loop filter 8 to select the first phase-locked loop circuit 9 or the third phase-locked loop circuit 25. A reference numeral 2 represents the high-frequency output terminal.

The oscillation frequency of the first voltage-controlled oscillator 1 is f1, and the oscillation frequency of the second voltage-controlled oscillator 10 is f2 which is close to f1. Furthermore, $fm = |f1 - f2|$ is a constant value.

An operation of the above-described frequency synthesizer will be discussed below.

The second phase-locked loop 16 is deactivated after completing one frequency switching operation and is again activated before initiating the next frequency switching operation. As the second phase-locked loop circuit 16 serves as a local oscillation source for the mixer 23 in the third phase-locked loop circuit 25 which is used in the transient response period after switching the frequency, it must has frequency stability but is not required high performance in S/N or C/N characteristics.

For this reason, the reference frequency of the second phase-locked loop circuit 16 is restricted to be identical with that of the first phase-locked loop circuit 9. It is, however, possible to increase the loop gain of the second phase-locked loop circuit 16 by increasing the sensitivity of the second voltage-controlled oscillator 10 or by decreasing the time constant of the second loop filter 15. Thus, the speedy frequency switching operation can be realized.

When the channel is switched, only the frequency component fm is chosen by using the filter 24 receiving the output of the mixer 23 whose inputs are fed from the first and second voltage-controlled oscillators 1, 10. With this output of the filter 24, the third phase-locked loop circuit 25 changes the frequency.

In this case, each of the sensitivity of the first voltage-controlled oscillator 1 and the time constant of the first loop filter 8 must be maintained in a limited range in order not to deteriorate the normal characteristics of the first phase-locked loop circuit 9. On the other hand, the reference frequency of the third phase-locked loop 25 is univocally determined by the first phase-locked loop circuit 9. The value of fm is, however, fairly small compared with the frequency of the first voltage-controlled oscillator 1. Therefore, the dividing number is small, too.

Accordingly, the loop gain of the third phase-locked loop 25 is very high compared with that of the first phase-locked loop circuit 9. That results in a very speedy frequency switching operation. Thus, the loop gains of the second and third phase-locked loop circuits 16, 25 are set higher than that of the first phase-locked loop circuit 9.

Thereafter, the switch 22 responds to the phase-locked loop switching signal (PLL switching signal) to change from the third phase-locked loop circuit 25 to the first phase-locked circuit 9.

During this switching operation, the first and third phase-locked loop circuits 9 and 25 are identical with each other in the frequency but are not identical in their phases. Accordingly, the transient response is required in order to correct their phases. This transient response tends to enlarge the overall time required for the frequency switching operation. In order to solve this problem, the phase adjustment means is provided in the switching operation.

The circuit configuration of the phase adjustment means is the same as that of the first embodiment, explained with reference to FIGS. 2 and 3. Therefore, its explanation is omitted here.

Though the value of fm is constant in the above-described embodiment, it is possible to define this fm differently as follows.

Let the oscillation frequency f2 of the second voltage-controlled oscillator 10 be a fixed value. Accordingly, fm=|f1−f2| varies with the oscillation frequency f1 of the first voltage-controlled oscillator 1.

An operation of the frequency synthesizer in the above-described condition will be described below.

As the value of fm varies in response to the switching of the frequency f1 of the first voltage-controlled oscillator 1, the fifth frequency divider 17 is controlled to vary its dividing number in response to the switching of the frequency f1, so that the output frequency of the fifth frequency divider 17 always corresponds to the reference frequency. Other basic operations are the same as those of the first embodiment.

As is apparent from the foregoing description, the second embodiment of the present invention provides the first and second phase-locked loop circuits and the third phase-locked loop circuit including the mixer. The loop gains of the second and third phase-locked loop circuits are set higher than that of the first phase-locked loop circuit. Furthermore, the phase adjustment circuit is provided in the first phase-locked loop circuit. Thus, the second embodiment of the present invention makes it possible to realize the speedy inter-channel frequency switching operation.

It is preferable that the second phase-locked loop circuit 16 is always activated, though it is deactivated until the channel switching operation initiates in the above-described embodiment.

Furthermore, it is necessary to use the same basic oscillator so as to be in phase of reference frequencies of the first, second, and third phase-locked loop circuits.

Moreover, the phase adjustment circuit is not limited to the disclosed one. Therefore, any other circuit can be adopted as long as it has a function of adjusting the phases of the first and second frequency dividers during the switching operation.

Still further, the first and second loop filters are constituted by nonlinear active elements.

THIRD EMBODIMENT

Figure 5:
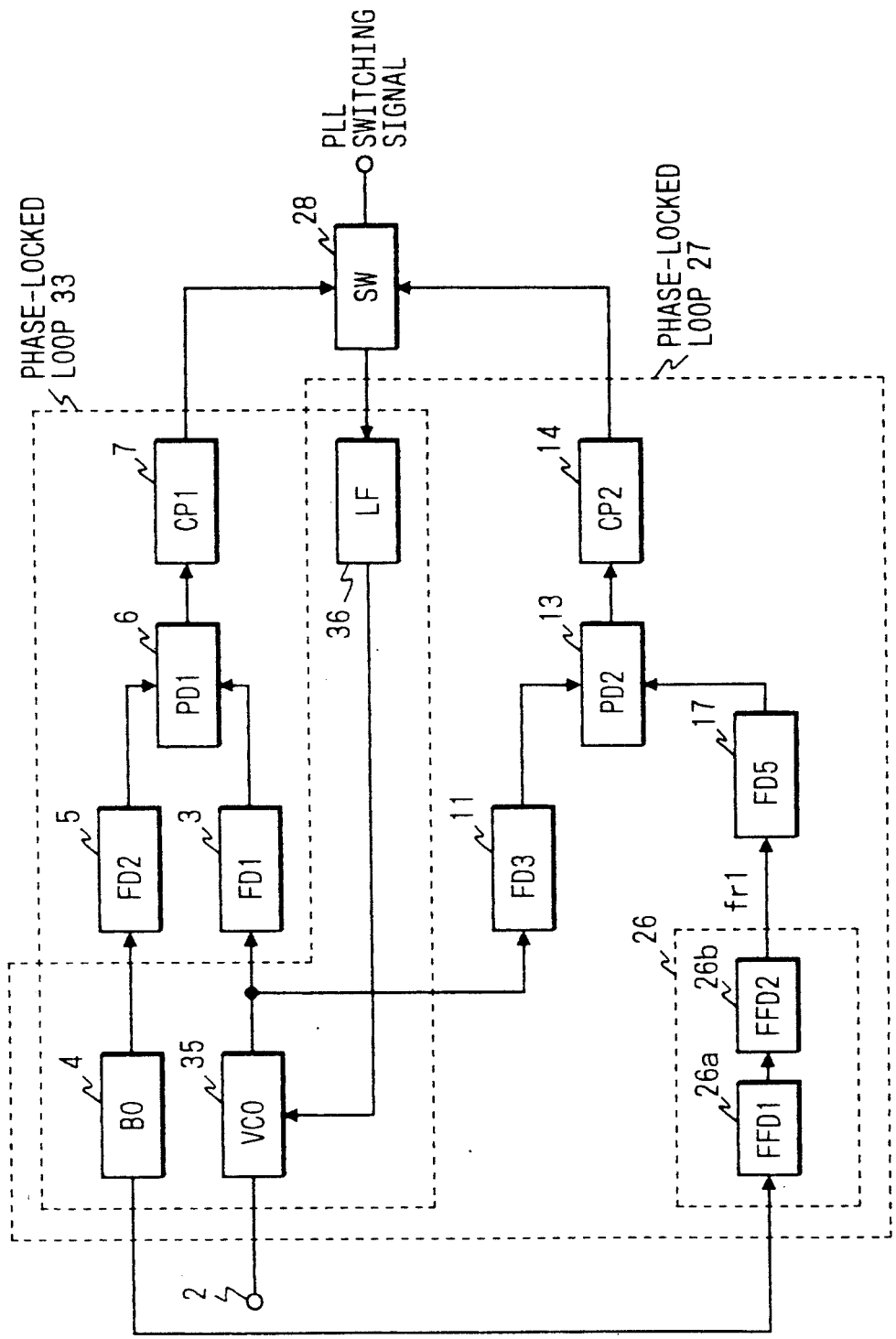
FIG. 5 is a circuit block diagram showing a frequency synthesizer in accordance with the third embodiment of the present invention.

FIG. 5 shows a circuit configuration of the frequency synthesizer in accordance with the third embodiment of the present invention.

The frequency synthesizer in accordance with the third embodiment includes first and second phase-locked loop circuits and a switch. The first phase-locked loop circuit 33 includes a voltage-controlled oscillator (abbreviated by VCO) 35, the first frequency divider 3 which divides the output frequency of the voltage-controlled oscillator 35, the basic oscillator 4 which is, for example, a normal temperature-compensated crystal oscillator, the second frequency divider 5 which divides the output frequency of the basic oscillator 4, the first phase detector 6 which detects the phase difference between the output of the first frequency divider 3 and the output of the second frequency divider 5, the first charge pump 7 which transforms the output of the first phase detector 6 into a drive signal for an integrator, and a loop filter 36 serving as the integrator, which feeds the output of the first charge pump 7 back to the voltage-controlled oscillator 35 after removing high-frequency components thereof.

The second phase-locked loop circuit 27 includes the voltage-controlled oscillator 35, the third frequency divider 11 which divides the output frequency of the voltage-controlled oscillator 35, the fourth frequency divider 26 consisting of a plurality of fractional frequency dividers 26a, 26b, - - - which divides the output frequency of the basic oscillator 4, the fifth frequency divider 17 which divides the output frequency of the fourth frequency divider 26, the second phase detector 13 which detects the phase difference between the output of the third frequency divider 11 and the output of the fifth frequency divider 17, the second charge pump 14 which transforms the output of the second phase detector 13 into the drive signal for the integrator, and the loop filter 36 which feeds the output of the second charge pump 14 back to the voltage-controlled oscillator 35 after removing high-frequency components thereof.

There is provided the switch 28 which is disposed before the loop filter 36 to select the first phase-locked loop circuit 33 or the second phase-locked loop circuit 27 on the basis of the phase-locked loop (PLL) switching signal. A reference numeral 2 represents the high-frequency output terminal.

An operation of the above-described frequency synthesizer will be discussed below. In order to make the understanding easy, it is supposed that the fourth frequency divider 26 is constituted by two fractional frequency dividers 26a and 26b. And, the fifth frequency divider 17 is neglected in the following description.

When the channel is switched, the second phase-locked loop circuit 27 switches the frequency. In this case, each of the sensitivity of the voltage-controlled oscillator 35 and the time constant of the loop filter 36 must be maintained in a limited range in order not to deteriorate the normal characteristics of the first phase-locked loop circuit 33. On the contrary, the reference frequency (i.e. dividing number) of the second phase-locked loop circuit 27 can be largely changed to be fairly higher than that of the first phase-locked loop circuit 33. Therefore, the loop gain of the second phase-locked loop circuit 27 is fairly increased by increasing its reference frequency, resulting in a very speedy frequency switching operation.

For example, let the reference frequency be 4.5 MHz. The frequency is changed from 900 MHz to 920 MHz. The oscillation frequency of the basic oscillator 4 is 5 MHz, and the dividing number of the third frequency divider 11 is 200.

Now, by setting the dividing number (M1) of the fractional frequency divider 26a to 11/10 and the dividing number (M2) of the fractional frequency divider 26b to 100/99, the output frequency (fr1) of the fourth frequency divider 26 becomes 4.5 MHz and the external output becomes 900 MHz.

On the other hand, by setting M1 to 14/13 and M2 to 108/107, the output frequency fr1 becomes 4.599987

MHz and the external output becomes 919.9974 MHz. The deviation between the set frequency and the external frequency depends on the number of fractional frequency dividers 26a, 26b, - - - . Therefore, it is possible to increase the accuracy by increasing the number of the fractional frequency dividers 26a, 26b, - - - .

As is described above, the loop gain of the second phase-locked loop circuit 27 is largely increased so as to realize the speedy frequency switching operation. This function results in quickly pre-charging the capacitance of the loop filter 36 up to the voltage of the set frequency.

Thereafter, the switch 28 responds to the phase-locked loop switching signal (PLL switching signal) to change from the second phase-locked loop circuit 27 to the first phase-locked circuit 33.

In the transient period during this switching operation, the phases of the first and second phase-locked loop circuits 27, 33 are corrected by the phase adjustment means whose circuit configuration is substantially the same as that explained with reference to FIGS. 2 and 3. In this third embodiment, the phase adjustment circuit is constructed by only substituting the voltage-controlled oscillator 35 and the loop filter 36 for the first voltage-controlled oscillator 1 and the first loop filter 8 of FIG. 2, respectively.

As is explained in the foregoing description, the third embodiment of the present invention provides the first and second phase-locked loop circuits. The second phase-locked loop circuit includes the frequency divider consisting of a plurality of fractional frequency dividers. And, the first phase-locked loop circuit includes the phase adjustment circuit. Thus, the third embodiment of the present invention makes it possible to realize the speedy inter-channel frequency switching operation.

Furthermore, it is needless to say that the frequency number of the fourth frequency divider 26 is not limited to the disclosed one in this embodiment. The number of the fractional frequency dividers can be freely increased.

Still further, the accuracy of the fractional divider can be improved by using the following fractional frequency divider.

Figure 6:
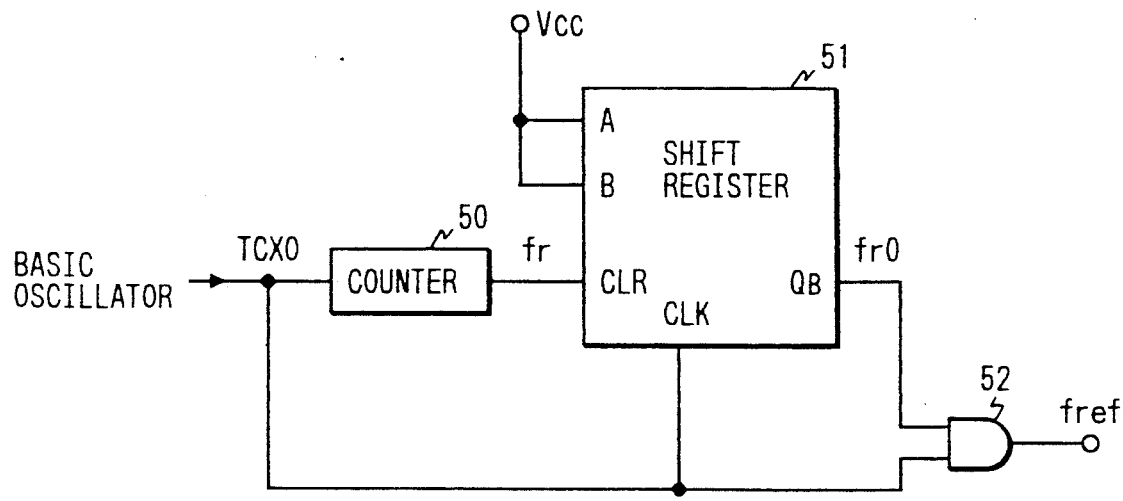
FIG. 6 is a circuit block diagram showing a fractional frequency divider adopted in the third embodiment of the present invention.

FIG. 6 shows one novel example of a fractional frequency divider adopted in this third embodiment. In FIG. 6, a counter 50 receives an output of the basic oscillator 4 and counts the pulse number of this output. A shift register 51 receives a count output of the counter 50 as a clear signal and the output of the basic oscillator 4 as a clock. And, an AND circuit 52 produces an AND result on the basis of the count output of the shift register 51 and the output of the basic oscillator 4.

The shift register 51 uses $Q_B$ terminal whose output builds up in response to a second arriving clock.

Figure 7:
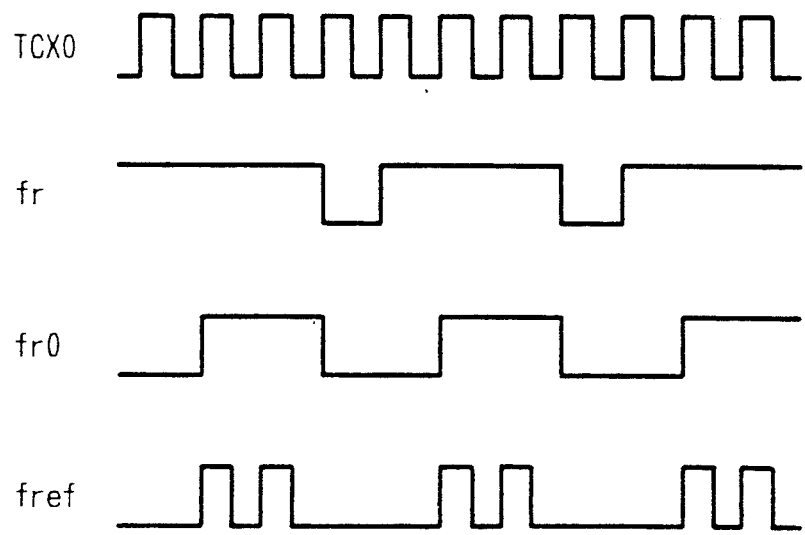
FIG. 7 is a graph showing waveforms of several portions of the fractional frequency divider; and, FIG. 8 is a circuit block diagram showing a conventional frequency synthesizer.
Figure 8:
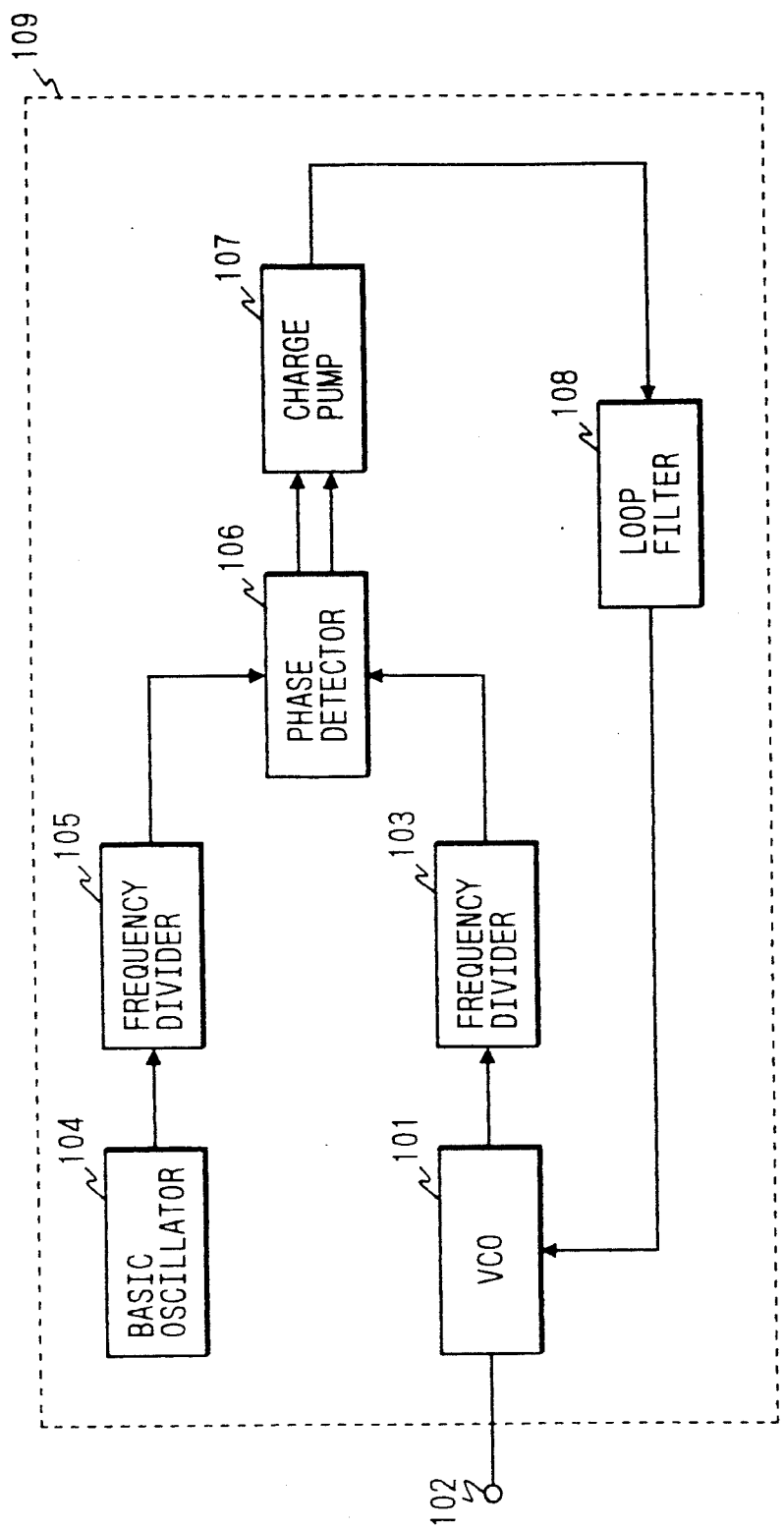

FIG. 7 shows waveforms of several portions of this fractional frequency divider. The output (TCXO) of the basic oscillator 4 is inputted into the counter 50. The shift register 51 is cleared in response to every output ($f_r$) of the counter 50. An output ($f_rO$) of the shift register 51 builds up at the timing when a second pulse is inputted into the clock terminal after the shift register 51 is cleared. Then, the output ($f_rO$) of the shift register 51 and the output (TCXO) of the basic oscillator 4 are composed in the AND circuit 52 so as to produce an AND output ($f_{ref}$). As a result, this fractional frequency divider removes two periods of the output signal of the basic oscillator 4.

The pulse number to be removed can be optionally changed by selecting the output. Therefore, this fractional frequency divider can remove any optional pulse(s).

Next, the effect of this novel fractional frequency divider increasing the accuracy of the output frequency is explained.

For example, let the reference frequency be 4.5 MHz. The target frequency is 915 MHz. The oscillation frequency of the basic oscillator 4 is 5 MHz, and the dividing number of the third frequency divider 11 is 200.

Now, by setting the dividing number (M1) of the fractional frequency divider 26a to 14/13 and the dividing number (M2) of the fractional frequency divider 26b to 137/135, the output frequency ($f_{ref}$) of the fourth frequency divider 26 becomes 4.57508 MHz and the external output becomes 915.0156 MHz. Accordingly, the difference between the target frequency and the external output can be suppressed within a very small amount.

Moreover in this embodiment, the phase adjustment circuit is not limited to the disclosed one. Therefore, any other circuit can be adopted as long as it has a function of adjusting the phases of the first and second frequency dividers during the switching operation.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A frequency synthesizer comprising first, second, and third phase-locked loops and a switch:

said first phase-locked loop including a first voltage-controlled oscillator, a first frequency divider which divides an output frequency of said first voltage-controlled oscillator, a second frequency divider which divides an output frequency of a basic oscillator, a first phase detector which detects a phase difference between an output of said first frequency divider and an output of said second frequency divider, a first charge pump which transforms an output of said first phase detector into a drive signal for a first integrator, and a first loop filter serving as said first integrator, which feeds an output of said first charge pump back to said first voltage-controlled oscillator;

said second phase-locked loop including a second voltage-controlled oscillator, a third frequency divider which divides an output frequency of said second voltage-controlled oscillator, a fourth frequency divider which divides the output frequency of a basic oscillator, a second phase detector which detects a phase difference between an output of said third frequency divider and an output of said fourth frequency divider, a second charge pump which transforms an output of said second phase detector into a drive signal for a second integrator, and a second loop filter serving as said second integrator, which feeds an output of the second charge pump back to the second voltage-controlled oscillator;

said third phase-locked loop including a fifth frequency divider which divides the output frequency of said first voltage-controlled oscillator, a sixth frequency divider which divides the output frequency of said second voltage-controlled oscillator, a third phase detector which detects a phase difference between an output of said fifth frequency divider and an output of said sixth frequency divider, a third charge pump which transforms an output of said third phase detector into a drive signal for said first loop filter which feeds an output of said third charge pump back to said first voltage-controlled oscillator; and said switch being disposed before said first loop filter so as to select said first phase-locked loop or said third phase-locked loop.

2. A frequency synthesizer in accordance with claim 1, wherein said first phase-locked loop further includes a phase adjustment circuit which adjusts the output of said first frequency divider and the output of said second frequency divider to be in phase in a switching operation from said third phase-locked loop to said first phase-locked loop.

3. A frequency synthesizer in accordance with claim 2, wherein said phase adjustment circuit includes a first gate circuit which interposes between said first voltage-controlled oscillator and said first frequency divider;

a second gate circuit which interposes between said basic oscillator and said second frequency divider;

a loop switch which interposes between said first phase detector and said first loop filter; and a controller including a shift register of more than three-bit, which receives the output of either said first frequency divider or said second frequency divider and a phase-locked loop switching signal, and gate circuits each receiving an output of said shift register and the output of said first phase detector.

4. A frequency synthesizer in accordance with claim 1, wherein the frequency of said second voltage-controlled oscillator is 1/L (L: a positive integer) of or identical with that of said first voltage-controlled oscillator.

5. A frequency synthesizer in accordance with claim 1, wherein the loop gains of said second and third phase-locked loops are higher than that of said first phase-locked loop.

6. A frequency synthesizer in accordance with claim 1, wherein said basic oscillator is used commonly for said first and second phase-locked loops.

7. A frequency synthesizer in accordance with claim 1, wherein said second phase-locked loop is deactivated after completing one frequency switching operation and is again activated before initiating the next frequency switching operation.

8. A frequency synthesizer in accordance with claim 1, wherein said first and second loop filters are constituted by nonlinear active elements.

9. A frequency synthesizer in accordance with claim 1, wherein a constant of said first loop filter is switched immediately after completing a switching operation from said third phase-locked loop to said first phase-locked loop.

10. A frequency synthesizer in accordance with claim 1, wherein a reference frequency of said third phase-locked loop is higher than those of said first and second phase-locked loops.

11. A frequency synthesizer comprising first, second, and third phase-locked loops and a switch:

said first phase-locked loop including a first voltage-controlled oscillator, a first frequency divider which divides an output frequency of said first voltage-controlled oscillator, a second frequency divider which divides an output frequency of a basic oscillator, a first phase detector which detects a phase difference between an output of said first frequency divider and an output of said second frequency divider, a first charge pump which transforms an output of said first phase detector into a drive signal for a first integrator, and a first loop filter serving as said first integrator, which feeds an output of said first charge pump back to said first voltage-controlled oscillator;

said second phase-locked loop including a second voltage-controlled oscillator, a third frequency divider which divides an output frequency of said second voltage-controlled oscillator, a fourth frequency divider which divides the output frequency of a basic oscillator, a second phase detector which detects a phase difference between an output of said third frequency divider and an output of said fourth frequency divider, a second charge pump which transforms an output of said second phase detector into a drive signal for a second integrator, and a second loop filter serving as said second integrator, which feeds an output of said second charge pump back to said second voltage-controlled oscillator;

said third phase-locked loop including a mixer which combines the output of said first voltage-controlled oscillator with that of said second voltage-controlled oscillator to produce an intermediate-frequency output, a filer which removes unnecessary components from the intermediate-frequency output of said mixer, a fifth frequency divider which divides an output frequency of said filter, a third phase detector which detects a phase difference between the output of the fourth frequency divider and an output of the fifth frequency divider, a third charge pump which transforms an output of said third phase detector into a drive signal for said first loop filter which feeds an output of said third charge pump back to the first voltage-controlled oscillator; and said switch being disposed before said first loop filter so as to select said first phase-locked loop or said third phase-locked loop.

12. A frequency synthesizer in accordance with claim 11, wherein said first phase-locked loop further includes a phase adjustment circuit which adjusts the output of said first frequency divider and the output of said second frequency divider to be in phase in a switching operation from said third phase-locked loop to said first phase-locked loop.

13. A frequency synthesizer in accordance with claim 12, wherein said phase adjustment circuit includes a first gate circuit which interposes between said first voltage-controlled oscillator and said first frequency divider;

a second gate circuit which interposes between said basic oscillator and said second frequency divider;

a loop switch which interposes between said first phase detector and said first loop filter; and a controller including a shift register of more than three-bit, which receives the output of either said first frequency divider or said second frequency divider and a phase-locked loop switching signal, and gate circuits each receiving an output of said shift register and the output of said first phase detector.

14. A frequency synthesizer in accordance with claim 11, wherein a difference between the oscillation frequency of said first voltage-controlled oscillator and that of said second voltage-controlled oscillator is constant.

15. A frequency synthesizer in accordance with claim 11, wherein the oscillation frequency of said second voltage-controlled oscillator is constant.

16. A frequency synthesizer in accordance with claim 11, wherein the loop gain of said second phase-locked loops is higher than that of said first phase-locked loop.

17. A frequency synthesizer in accordance with claim 11, wherein said basic oscillator is used commonly for said first, second, and third phase-locked loops.

18. A frequency synthesizer in accordance with claim 11, wherein said second phase-locked loop is deactivated after completing one frequency switching operation and is again activated before initiating the next frequency switching operation.

19. A frequency synthesizer in accordance with claim 11, wherein said first and second loop filters are constituted by nonlinear active elements.

20. A frequency synthesizer in accordance with claim 11, wherein a constant of said first loop filter is switched immediately after completing a switching operation from said third phase-locked loop to said first phase-locked loop.

21. A frequency synthesizer comprising first and second phase-locked loops and a switch:
    said first phase-locked loop including a voltage-controlled oscillator, a first frequency divider which divides an output frequency of said voltage-controlled oscillator, a second frequency divider which divides an output frequency of a basic oscillator, a first phase detector which detects a phase difference between an output of said first frequency divider and an output of said second frequency divider, a first charge pump which transforms an output of said first phase detector into a drive signal for an integrator, and a loop filter serving as said integrator, which feeds an output of the first charge pump back to said voltage-controlled oscillator;
    said second phase-locked loop including said voltage-controlled oscillator, a third frequency divider which divides an output frequency of said voltage-controlled oscillator, a fourth frequency divider consisting of a plurality of fractional frequency dividers which divides an output frequency of said basic oscillator, a fifth frequency divider which divides an output frequency of said fourth frequency divider, a second phase detector which detects a phase difference between an output of said third frequency divider and an output of said fifth frequency divider, a second charge pump which transforms an output of said second phase detector into the drive signal for said loop filter; and
    said switch disposed before said loop filter and selecting either of said first phase-locked loop or said second phase-locked loop.

22. A frequency synthesizer in accordance with claim 21, wherein said first phase-locked loop further includes a phase adjustment circuit which adjusts the output of said first frequency divider and the output of said second frequency divider to be in phase in a switching operation from said second phase-locked loop to said first phase-locked loop.

23. A frequency synthesizer in accordance with claim 21 wherein at least one of said:
    fractional frequency dividers has a fractional dividing number;
    said fractional dividing number being expressed by a numerator coefficient and a denominator coefficient;
    both of said numerator coefficient and denominator coefficient being controlled by removing optional-period component from a signal inputted thereto.

24. A frequency synthesizer in accordance with claim 23, said fractional frequency divider comprising a counter receiving an output of a basic oscillator and counting pulse number of this output, a shift register which receives a count output of said counter as a clear signal and the output of said basic oscillator as a clock, and an AND circuit which produces an AND result on the basis of an output of said shift register and the output of said basic oscillator.

* * * * *